(12) United States Patent
Kim

(10) Patent No.: US 7,061,031 B1
(45) Date of Patent: Jun. 13, 2006

(54) HIGH-SENSITIVITY IMAGE SENSOR AND FABRICATION METHOD THEREOF

(75) Inventor: Hoon Kim, Yongin-si (KR)

(73) Assignee: Korea Electronics Technology Institute, Pyeongtaek-si (KR)

( * ) Notice: Subject to any disclaimer, the term of this patent is extended or adjusted under 35 U.S.C. 154(b) by 0 days.

(21) Appl. No.: 11/024,783

(22) Filed: Dec. 30, 2004

(51) Int. Cl.
*H01L 27/148* (2006.01)
*H01L 21/00* (2006.01)

(52) U.S. Cl. ............... 257/222; 257/225; 257/232; 257/290; 257/291; 438/48; 438/57; 438/325; 438/532

(58) Field of Classification Search ........... 257/222, 257/225, 232, 290, 291; 438/48, 57, 325, 438/532
See application file for complete search history.

(56) References Cited

U.S. PATENT DOCUMENTS

| 5,901,257 | A | 5/1999 | Chen et al. |
| 6,020,581 | A | 2/2000 | Dennard et al. |
| 6,127,697 | A | 10/2000 | Guidash |
| 6,380,037 | B1 | 4/2002 | Osanai |
| 6,979,587 | B1* | 12/2005 | Lee ............... 438/57 |
| 2003/0096443 | A1* | 5/2003 | Hwang ............ 438/59 |

OTHER PUBLICATIONS

U.S. Appl. No. 11/024,787 to Kim, which was filed on Dec. 30, 2004.

* cited by examiner

*Primary Examiner*—Hsien-Ming Lee
(74) *Attorney, Agent, or Firm*—Greenblum & Bernstein, P.L.C.

(57) ABSTRACT

A method of fabricating a high-sensitivity image sensor is disclosed. The disclosed method comprises: etching a predetermined region of active silicon and a buried oxide layer by using a mask over an SOI substrate to expose an N-type silicon substrate; implanting P-type ions into the exposed N-type silicon substrate to form a P-type region; forming crossed active silicon by patterning the rest of the active silicon not etched while the active silicon is etched to expose the N-type silicon substrate; implanting P-type ions into first two predetermined regions facing each other of the crossed active silicon to form P-type regions; implanting N-type ions into second two predetermined regions facing each other except for the P-type regions of the crossed active silicon to form N-type regions; forming a gate oxide layer and a gate electrode on the crossed active silicon; and forming a connection part to connect the P-type region of the crossed active silicon to the P-type region of the silicon substrate.

20 Claims, 5 Drawing Sheets

HIGH-SENSITIVITY IMAGE SENSOR AND FABRICATION METHOD THEREOF

BACKGROUND OF THE INVENTION

1. Field of the Invention

The present invention relates to an image sensor and, more particularly, to a high-sensitivity image sensor embodied on a silicon-on-insulator (hereinafter referred to as "SOI"), achieving a high sensitivity and a high degree of integration.

2. Background of the Related Art

Referring to FIG. 1a, an image sensor generally has stacked structure comprising a P-type silicon substrate 1 and an N-type silicon substrate 2 formed by epitaxial growth. The stacked structure also includes a photodiode 3 and a bipolar transistor 4 that functions as a circuit for processing a signal produced from the photodiode 3. The N-type silicon substrate is divided into plural regions by P-type buried diffusion layers 5. The photodiode 3 and the bipolar transistor 4 are provided in or on the plural regions of the N-type silicon substrate.

The photodiode 3 is constructed by using a PN junction that is an interface between the P-type silicon substrate 1 and the N-type silicon substrate 2. The bipolar transistor 4 has a P-type diffusion layer in the upper part of the N-type silicon substrate 2. An $N^+$-type diffusion layer 7 is placed from the surface of the N-type silicon substrate 2 to the upper part of the P-type silicon substrate 1.

An oxide layer 6 is provided on the entire surface of the N-type silicon substrate 2. For the bipolar transistor, metal interconnects are connected to the $N^+$-type diffusion layer 7, and the P-type diffusion layer. The photosensitivity of this type of the photodiode depends on the photosensitivity of the PN junction as well as the absorption amount influenced by the size and the thickness of the photodiode.

FIG. 1b is a cross-sectional view illustrating an image sensor on an SOI wafer. The SOI wafer comprises a P-type silicon substrate 11 and an N-type silicon substrate 12 under which an N-type diffusion layer 19 is placed. An oxide layer 13 is positioned between the P-type silicon substrate 11 and the N-type diffusion layer 19.

The N-type silicon substrate 12 is divided into plural regions by trench-type isolation layers 14. A photodiode 15 and a bipolar transistor 16 are provided in or on the plural regions of the N-type silicon substrate 12. The trench-type isolation layers 14 extend from an oxide layer 17 positioned on the $N^-$ type silicon substrate 12 to the upper part of the oxide layer 13.

For the photodiode 15, a P-type diffusion layer which acts as an active layer, is positioned near the surface of the N-type silicon substrate 12. An $N^+$-type diffusion layer 18 extends from the surface of N-type silicon substrate 12 to the N-type diffusion layer 19.

A conventional CMOS image sensor using a bulk-silicon substrate has a technical limitation in terms of the improvement of sensitivity and a noise characteristic, and the possibility that light-excited carriers can be created in undesirable region by light irradiation always remains. Furthermore, a presence of parasitic stray capacitance causes an increment of a noise and the degradation of operation speed, so that a characteristic of the sensor is deteriorated. In detail, for the CMOS image sensor using a bulk-silicon substrate, a dark current component, which is a type of leakage current generated when a depletion region of an intrinsic semiconductor is formed toward the substrate, works as a noise component of a photo-current. Such a characteristic decreases sensitivity of the sensor and a response speed of the photo current, so that a response speed to an incoming image gets to fall.

Moreover, for a CMOS image sensor using a conventional SOI substrate, an epitaxial silicon layer placed on a buried oxide layer is so thin that an operation of a high voltage transistor is difficult.

SUMMARY OF THE INVENTION

Accordingly, the present invention is directed to a high sensitivity image sensor and fabrication method thereof that substantially obviates one or more problems due to limitations and disadvantages of the related art.

An object of the present invention is to provide a method of fabricating a high-sensitivity image sensor embodied on a SOI, achieving a high sensitivity and a high degree of integration.

Another object of the present invention is to provide a high-sensitivity image sensor embodied on a SOI, achieving a high sensitivity and a high degree of integration.

To achieve these objects and other advantages and in accordance with the purpose of the invention, as embodied and broadly described herein, a method of fabricating a high-sensitivity image sensor comprises: etching a predetermined region of active silicon and a buried oxide layer by using a mask over an SOI substrate to expose an N-type silicon substrate; implanting P-type ions into the exposed N-type silicon substrate to form a P-type region; forming crossed active silicon by patterning the rest of the active silicon not etched while the active silicon is etched to expose the N-type silicon substrate; implanting P-type ions into first two predetermined regions facing each other of the crossed active silicon to form P-type regions; implanting N-type ions into second two predetermined regions facing each other except for the P-type regions of the crossed active silicon to form N-type regions; forming a gate oxide layer and a gate electrode on the cross active silicon; and forming a connection part to connect the P-type region of the cross active silicon to the P-type region of the silicon substrate. A high-sensitivity image sensor comprises: a photodiode region having a PN junction between an N-type substrate and a P-type region thereon; a crossed monocrystalline active silicon at a distance to the photodiode region; source and drain regions in the first two end parts of the crossed monocrystalline active silicon; impurity regions in the second end parts except for the source and drain regions; a channel region between the source and drain regions; a gate oxide layer on the channel region; a gate electrode on the gate oxide layer; and a connection part connecting the impurity regions to the P-type region of the photodiode region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1A:
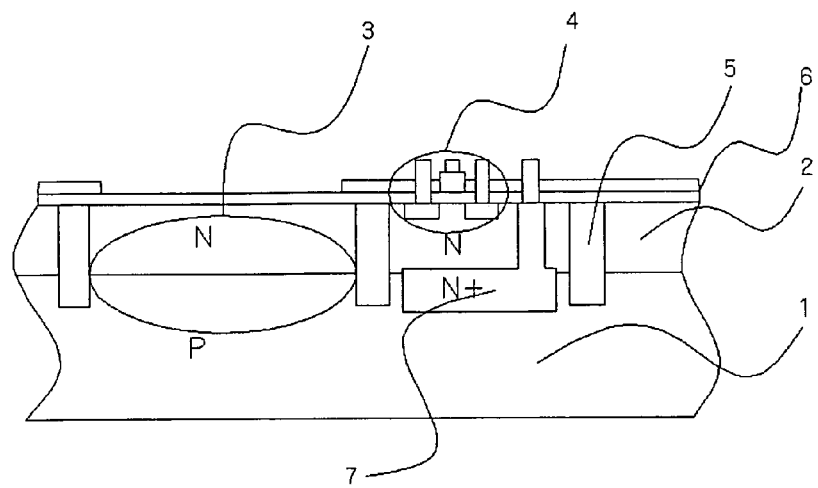
FIGS. 1a and 1b are image sensors fabricated in accordance with the prior art.
Figure 1B:
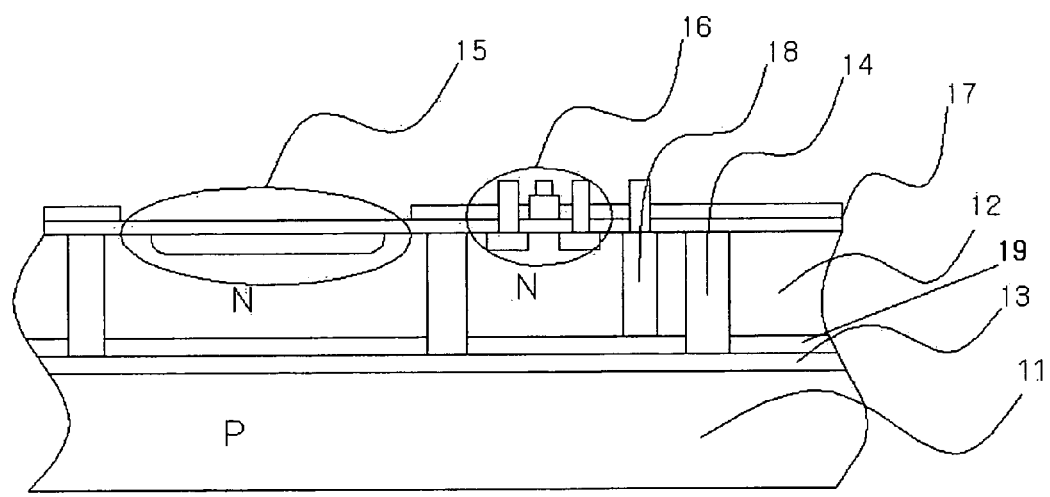
Figure 2:
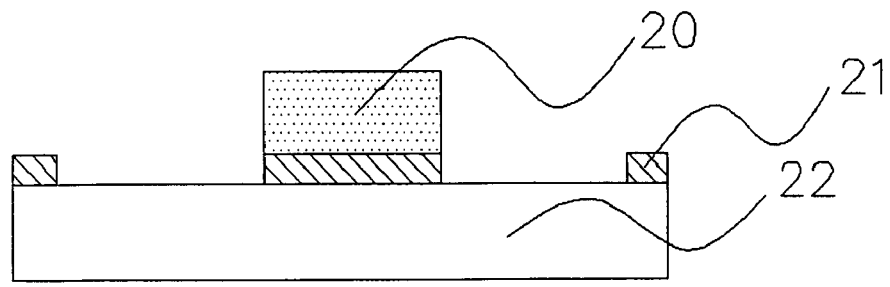
FIGS. 2 through 8 are cross-sectional views illustrating example processes of fabricating a high-sensitivity image sensor in accordance with the present invention.

First, referring to FIG. 2, predetermined regions of active silicon 20 and a buried oxide layer 21 are etched by using a mask over an SOI substrate to expose an N-type silicon substrate 22. The SOI substrate can be manufactured according to various kind of fabrication methods. Particularly, the SOI substrate manufactured by an SIMOX (separation by implanted oxygen) method has a characteristic that the active silicon on a buried oxide layer is monocrystalline.

Figure 3:
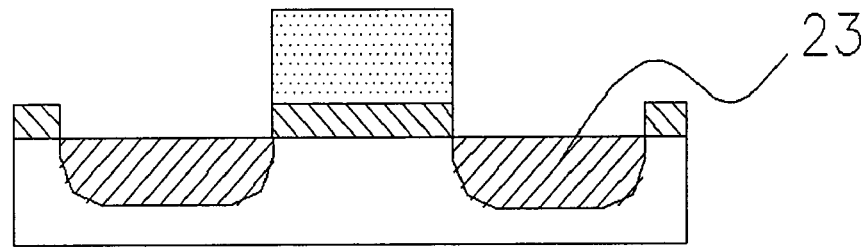

Referring to FIG. 3, P-type ions are implanted into the exposed N-type silicon substrate 22 to form P-type regions 23, so that a PN junction is completed. A photodiode is defined by the PN junction. The ion implantation is conducted to the sufficient depth for ensuring that irradiated light is converted to photoelectrons as much as possible. In addition, the shape of the photodiode is preferably buried-type so that a dark current can be minimized.

Figure 4A:
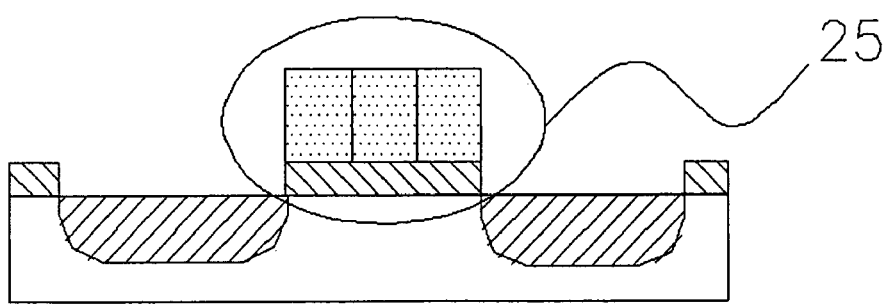
Figure 4B:
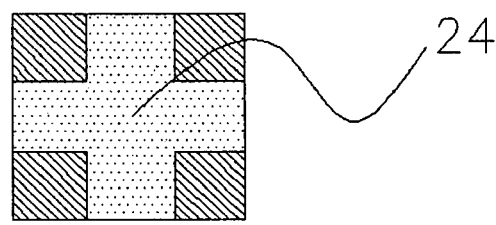

Referring to FIGS. 4a and 4b, crossed active silicon 24 is formed by patterning the rest of the active silicon 25 not etched while the active silicon is etched to expose the N-type silicon substrate 22. The crossed active silicon 24 is a cross shape with four branches, each of which has a predetermined length as seen from the top.

Figure 5A:
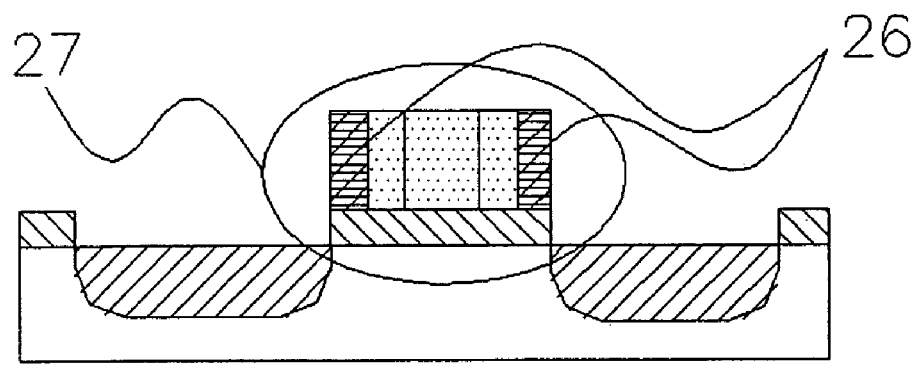
Figure 5B:
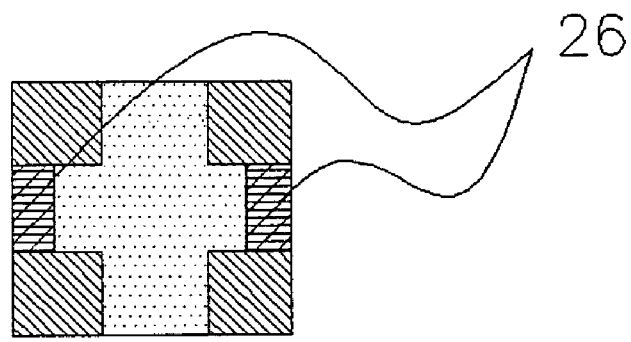

FIG. 5a is a cross-sectional view illustrating the process that implants P-type ions into two end parts 26 facing each other of the crossed active silicon 24 to form P-type regions. FIG. 5b is a top view illustrating a crossed active silicon region 27. The P-type regions face each other and are connected to the P-type region 23 of the photodiode.

Figure 6A:
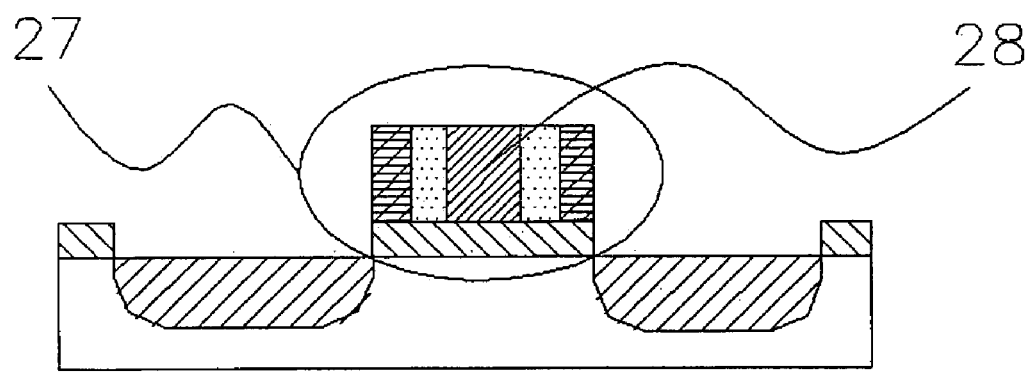
Figure 6B:
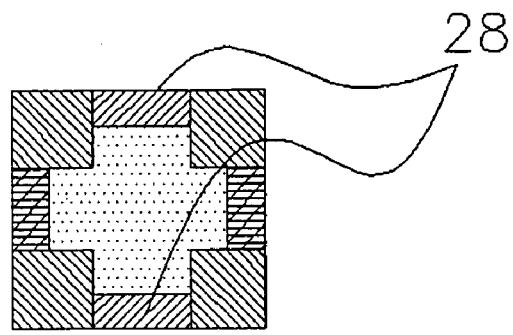

FIG. 6a is a cross-sectional view illustrating the process that implants N-type ions into two end parts of the crossed active silicon 24 except the P-type regions 26 to form N-type regions 28 as source and drain regions. FIG. 6b is a top view illustrating the crossed active silicon region 27.

Figure 7:
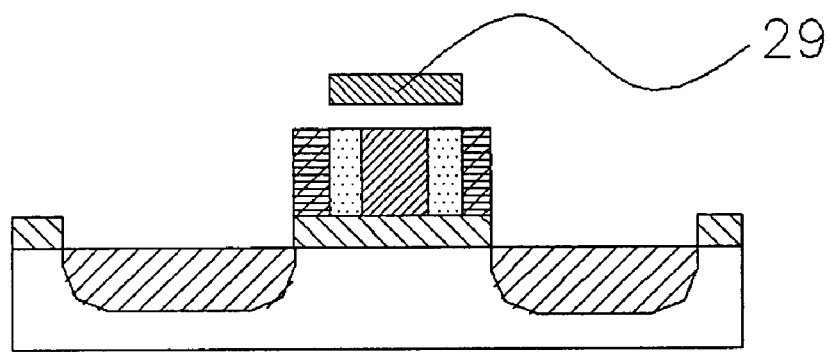

Referring to FIG. 7, after a gate insulation layer and a silicon layer are sequentially provided on the crossed active silicon 24, a gate electrode 29 is completed by patterning and etching the gate insulation layer and the silicon layer. The gate electrode has a narrower width than that of the region excluding the P-type regions and the N-type regions from the crossed active silicon region 27.

Figure 8:
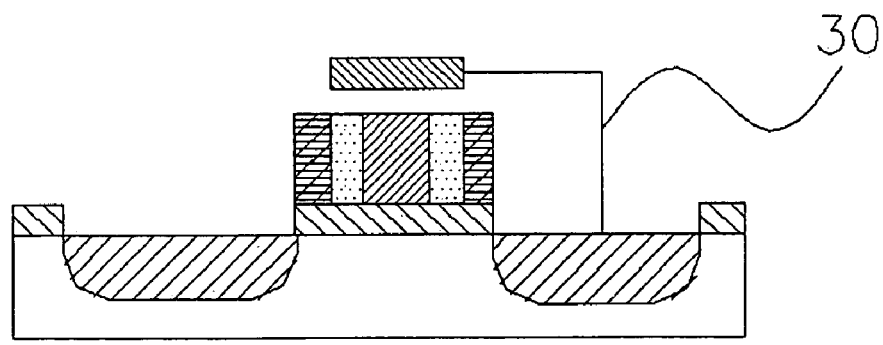

Referring to FIG. 8, a connection part 30, which connects the P-type region 26 of the crossed active silicon to the P-type region 23 of the photodiode, is completed.

Figure 9:
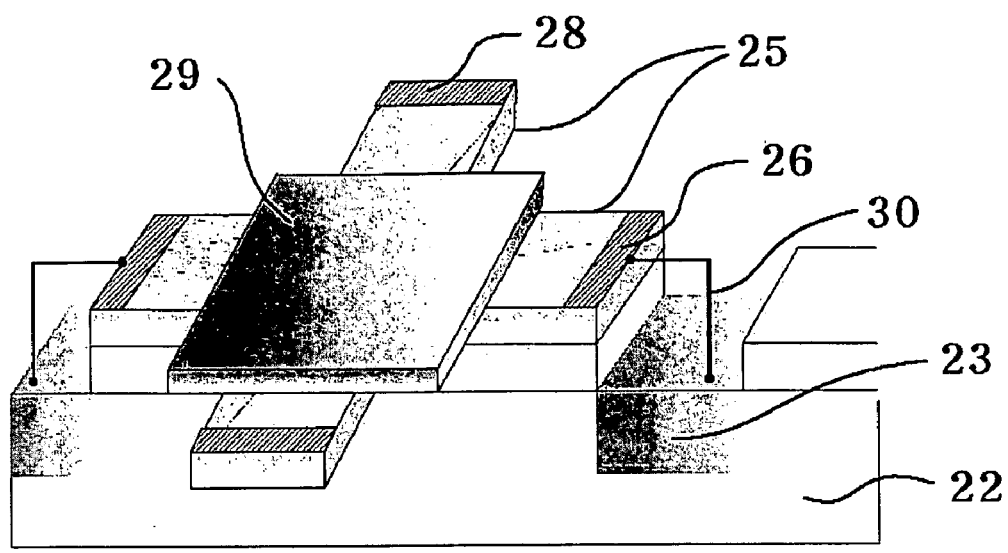
FIG. 9 illustrates structure of a high-sensitivity image sensor in accordance with the present invention.

Referring to FIG. 9, a photodiode region is shown, having the PN junction between the P-type silicon substrate 23 and the N-type silicon substrate 22. A crossed monocrystalline active silicon region 25 formed by etching the monocrystalline active silicon, which lies at a distance to the photodiode region on the SOI substrate, is presented. The monocrystalline active silicon is originated from the construction of the SOI substrate. The P-type regions 26, which are formed by implanting P-type ions into two end parts facing each other out of four end parts of the crossed active silicon 24, are also shown. The P-type regions of the photodiode and the crossed monocrystalline active silicon are tied by the connection part 30. The N-type regions 28 are presented in two end parts of the crossed active silicon region not occupied by the P-type regions 26 and defined as source and drain regions. The gate oxide layer (not shown) and the gate electrode 29 are positioned on the crossed monocrystalline active silicon. The gate electrode 29 has a narrower width than that of the region excluding the P-type regions and the N-type regions from the crossed active silicon region 27.

Figure 10:
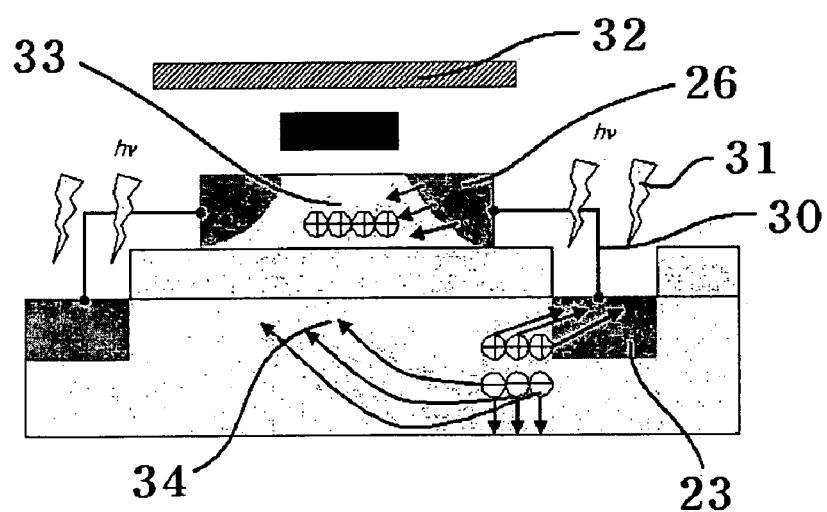
FIG. 10 is a cross-sectional view illustrating operation principles of a high-sensitivity image sensor in accordance with the present invention.

FIG. 10 is a cross-sectional view illustrating the operation principle of a high-sensitivity image sensor in accordance with the present invention. Light is irradiated 31 on the photodiode region. A light shield screen 32 is provided to prevent light from being irradiated on the region except for the photodiode region. The light shield screen 32 is positioned over the crossed active silicon and the gate electrode, and preferably made of Al. Electron-hole pairs are created in the photodiode by the light irradiation. The holes move along the P-type regions 23 of the photodiode, the connection part 30 and the P-type regions 26 located in the end parts of the crossed monocrystalline active silicon, and are accumulated in the middle part 33 of the monocrystalline active silicon. The electrons move along the N-type substrate and are accumulated under a buried oxide layer 34 that is positioned below the middle part of the monocrystalline active silicon.

If a certain amount of the holes are accumulated in the middle part 33 of the monocrystalline active silicon, a PNP lateral bipolar transistor (hereinafter referred to as "LBT") is constructed by the source, the middle part of the monocrystalline active silicon and the drain, which are vertically positioned. Thus, the PNP LBT may effectively operate. In detail, a electrode is intentionally fabricated to adjust electric potential with light-excited pumping carriers in the neutral region under a channel of a photosensing transistor (or photo transistor) that produces a signal charge. The electrode is intended to send a signal to the photodiode positioned in the lower substrate so as to obtain a sufficient dynamic range and maximize the realization of an input color signal. The electrons, which are light-excited minority carriers and accumulated under the buried oxide layer, function as a substrate bias, so that potential in the middle part of the monocrystalline active silicon is increased.

Accordingly, the disclosed method using the SOI substrate reduces a dark current that occurs in an image sensor, a unit cell size and parasitic stray capacitance of the image sensor, so that the image sensor embodied by the illustrated method operates at a high speed and has a high sensitivity.

It is noted that this patent claims priority from Korean Patent Application Serial Number 10-2003-0087286, which was filed on Dec. 31, 2003, and is hereby incorporated by reference in its entirety.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a high-sensitivity image sensor comprising:
   etching a predetermined region of active silicon and a buried oxide layer by using a mask over an SOI substrate to expose an N-type silicon substrate;
   implanting P-type ions into the exposed N-type silicon substrate to form a P-type region;
   forming crossed active silicon by patterning the rest of the active silicon not etched while the active silicon is etched to expose the N-type silicon substrate;
   implanting P-type ions into first two predetermined regions facing each other of the crossed active silicon to form P-type regions;
   implanting N-type ions into second two predetermined regions facing each other except for the P-type regions of the crossed active silicon to form N-type regions;
   forming a gate oxide layer and a gate electrode on the crossed active silicon; and
   forming a connection part to connect the P-type region of the crossed active silicon to the P-type region of the silicon substrate.

2. A method as defined by claim 1, further comprising forming a light shield screen over the crossed active silicon and the gate electrode after the formation of the connection part.

3. A method as defined by claim 2, wherein the light shield screen is made of Al.

4. A method as defined by claim 2, wherein the N-type regions of the crossed active silicon are source and drain regions.

5. A method as defined by claim 2, wherein the first two predetermined regions are two end parts facing each other of the crossed active silicon.

6. A method as defined by claim 2, wherein the gate oxide layer and the gate electrode are formed on the middle part of the crossed active silicon by sequentially depositing a gate oxide layer and a silicon layer, and patterning and etching the gate oxide layer and the silicon layer.

7. A method as defined by claim 1, wherein the N-type regions of the crossed active silicon are source and drain regions.

8. A method as defined by claim 1, wherein the two predetermined regions are two end parts facing each other of the crossed active silicon.

9. A method as defined by claim 1, wherein the gate oxide layer and the gate electrode are formed on the middle part of the crossed active silicon by sequentially depositing a gate oxide layer and a silicon layer, and patterning and etching the gate oxide layer and the silicon layer.

10. A high-sensitivity image sensor comprising:
    a photodiode region having a PN junction between an N-type substrate and a P-type region thereon;
    a crossed monocrystalline active silicon at a distance to the photodiode region;
    source and drain regions in the first two end parts of the crossed monocrystalline active silicon;
    impurity regions in the second end parts except for the source and drain regions;
    a channel region between the source and drain regions;
    a gate oxide layer on the channel region;
    a gate electrode on the gate oxide layer; and
    a connection part connecting the impurity regions to the P-type region of the photodiode region.

11. A high-sensitivity image sensor as defined by claim 10, further comprising a light shield screen over the crossed active silicon and the gate electrode.

12. A high-sensitivity image sensor as defined by claim 11, wherein the light shield screen is made of Al.

13. A high-sensitivity image sensor as defined by claim 11, wherein the source and drain regions of the crossed monocrystalline active silicon are doped with P-type dopants.

14. A high-sensitivity image sensor as defined by claim 11, wherein the impurity regions in the second end parts of the crossed monocrystalline active silicon except for the source and drain regions are doped with N-type dopants.

15. A high-sensitivity image sensor as defined by claim 11, wherein an lateral bipolar transistor is constructed in the crossed active silicon by movement and accumulation of holes created in the photodiode.

16. A high-sensitivity image sensor as defined by claim 11, wherein the photodiode is a buried-type photodiode.

17. A high-sensitivity image sensor as defined by claim 10, wherein the source and drain regions of the crossed monocrystalline active silicon are doped with P-type dopants.

18. A high-sensitivity image sensor as defined by claim 10, wherein the impurity regions in the second end parts of the crossed monocrystalline active silicon except for the source and drain regions are doped with N-type dopants.

19. A high-sensitivity image sensor as defined by claim 10, wherein an lateral bipolar transistor is constructed in the crossed active silicon by movement and accumulation of holes created in the photodiode.

20. A high-sensitivity image sensor as defined by claim 10, wherein the photodiode is a buried-type photodiode.

* * * * *